(12) United States Patent
Kim

(10) Patent No.: US 7,943,965 B2
(45) Date of Patent: May 17, 2011

(54) MULTI-BIT PHASE-CHANGE MEMORY DEVICE

(75) Inventor: Hyoung Joon Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/344,684

(22) Filed: Dec. 29, 2008

(65) Prior Publication Data

US 2009/0302294 A1 Dec. 10, 2009

(30) Foreign Application Priority Data

Jun. 5, 2008 (KR) .................. 10-2008-0053142

(51) Int. Cl.
*H01L 21/02* (2006.01)
(52) U.S. Cl. ......... 257/200; 257/E45.002; 257/E27.004; 438/42; 438/95
(58) Field of Classification Search .................. 438/42, 438/95; 257/200, E45.002, E27.004
See application file for complete search history.

(56) References Cited

U.S. PATENT DOCUMENTS

| | | | |
|---|---|---|---|
| 7,521,281 B2 * | 4/2009 | Lee et al. | 438/95 |
| 2005/0242338 A1 * | 11/2005 | Hart et al. | 257/3 |
| 2005/0265072 A1 * | 12/2005 | Hart et al. | 365/163 |
| 2006/0270180 A1 * | 11/2006 | Lee et al. | 438/409 |
| 2007/0230237 A1 * | 10/2007 | Schwerin et al. | 365/163 |
| 2008/0111120 A1 * | 5/2008 | Lee et al. | 257/2 |
| 2008/0142777 A1 * | 6/2008 | Park et al. | 257/4 |
| 2009/0283739 A1 * | 11/2009 | Kiyotoshi | 257/4 |

FOREIGN PATENT DOCUMENTS

KR  1020050091902 A  9/2005

* cited by examiner

*Primary Examiner* — George Fourson
*Assistant Examiner* — John M Parker
(74) *Attorney, Agent, or Firm* — Ladas & Parry LLP

(57) ABSTRACT

A multi-bit phase-change memory device includes a semiconductor substrate with a plurality of phase-change patterns sequentially stacked above the semiconductor substrate. Each phase-change pattern crosses another phase change pattern, and each phase change pattern includes a phase-change conductive line formed on a surface thereof. Bipolar transistors are installed between the semiconductor substrate and the lowermost phase-change pattern and also among the phase-change patterns, and the bipolar transistors selectively form electrical connections between the semiconductor substrate and the lowermost phase-change pattern and also among the phase-change patterns. Heating electrodes are aligned between the respective bipolar transistors and phase-change patterns. The semiconductor substrate includes an active area that extends in a direction that is perpendicular to the extension direction of the lowermost phase-change pattern.

24 Claims, 4 Drawing Sheets

MULTI-BIT PHASE-CHANGE MEMORY DEVICE

CROSS-REFERENCES TO RELATED APPLICATION

The present application claims priority to Korean application number 10-2008-0053142, filed on Jun. 5, 2008, which is incorporated by reference in its entirety.

BACKGROUND OF THE INVENTION

The present invention relates generally to a phase-change memory device, and more particularly, to a multi-bit phase-change memory device.

In general, phase-change materials for use in a memory device refer to materials having a phase that changes according to temperature. The resistance of the phase-change material can vary depending on the state (i.e., the phase) of the phase-change material. For example, in a phase change material the phase of the material can be allowed to change between a crystalline state and an amorphous state with the crystalline state having a resistance that is different from that of the amorphous state. Therefore, the phase-change material can be used as a storage medium in a memory device, since the difference in resistance can be used to define the "states" of information (e.g. the different resistance may be used to define a logic '0' or a logic '1'). A memory device including the phase-change material is typically referred to as a phase-change memory device.

A typical phase-change memory device includes a plurality of word lines and a plurality of bit lines that cross (i.e., intersect) the word lines, and typically the point at which a world line and a bit line intersect defines a unit memory cell. A phase-change memory device also typically includes a switching device for selecting the word lines, and a phase-change device cooperating with the switching device in order to store data.

The switching device typically includes a diode, and the phase-change device includes a bottom electrode, a phase-change material layer, and a top electrode. The bottom electrode of the phase-change device is electrically connected to the diode.

Theoretically, the phase-change memory device can obtain logic "0", logic "1" and an intermediate value according to the phase (for example, the crystalline state) of the phase-change material layer.

However, in order to realize a multi-bit phase change memory device (i.e., a phase change device that can obtain more bits (intermediate values) than simply the logic "0", logic "1"), the phase-change memory device must be driven in a specific driving scheme different from the driving scheme of the conventional phase-change memory device.

In other words, the phase-change material used for the multi-bit phase change memory device must exhibit a linear characteristic relative to electrical or terminal energy when the state of the phase-change material is changed from the amorphous state to the crystalline state or vice versa. If a phase-change material that does not exhibit a linear characteristic is employed in the memory device, the operational conditions must be determined in the process of reading or writing information of the intermediate state, thereby requiring very complex peripheral circuits for driving the memory device.

SUMMARY

Embodiments of the present invention include a multi-bit phase-change memory device, which can be obtained without requiring new phase-change material and complex peripheral circuits.

In one aspect, a multi-bit phase-change memory device includes a plurality of phase-change patterns which are stacked while crossing each other, and switching devices interposed among the phase-change patterns in a longitudinal direction to selectively apply current to the phase-change patterns.

In another aspect, a multi-bit phase-change memory device includes a semiconductor substrate, a plurality of phase-change patterns which are sequentially stacked above the semiconductor substrate while crossing each other and formed one surface thereof with a phase-change conductive line, respectively, bipolar transistors installed between the semiconductor substrate and a lowermost phase-change pattern and among the phase-change patterns in order to selectively make electric-connection between the semiconductor substrate and the lowermost phase-change pattern and among the phase-change patterns, and heating electrodes aligned between the bipolar transistors and the phase-change patterns, respectively.

At that time, the semiconductor substrate can include an active area that extends perpendicularly to the lowermost phase-change pattern.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE PREFERRED EMBODIMENTS

Hereinafter, the present invention will be described in detail through embodiments. The embodiments are solely for exemplifying the present invention, and the scope of right to be protected of the present invention is not limited by the following embodiments.

According to the preferred embodiments, phase-change patterns including phase-change materials are stacked while crossing each other, thereby forming a multi-bit phase-change memory device. In addition, switching devices are installed at intersections between the phase-change patterns to realize selective multi-bits.

The multi-bit phase-change memory device will be described below with reference to FIGS. 1 and 2.

Figure 1:
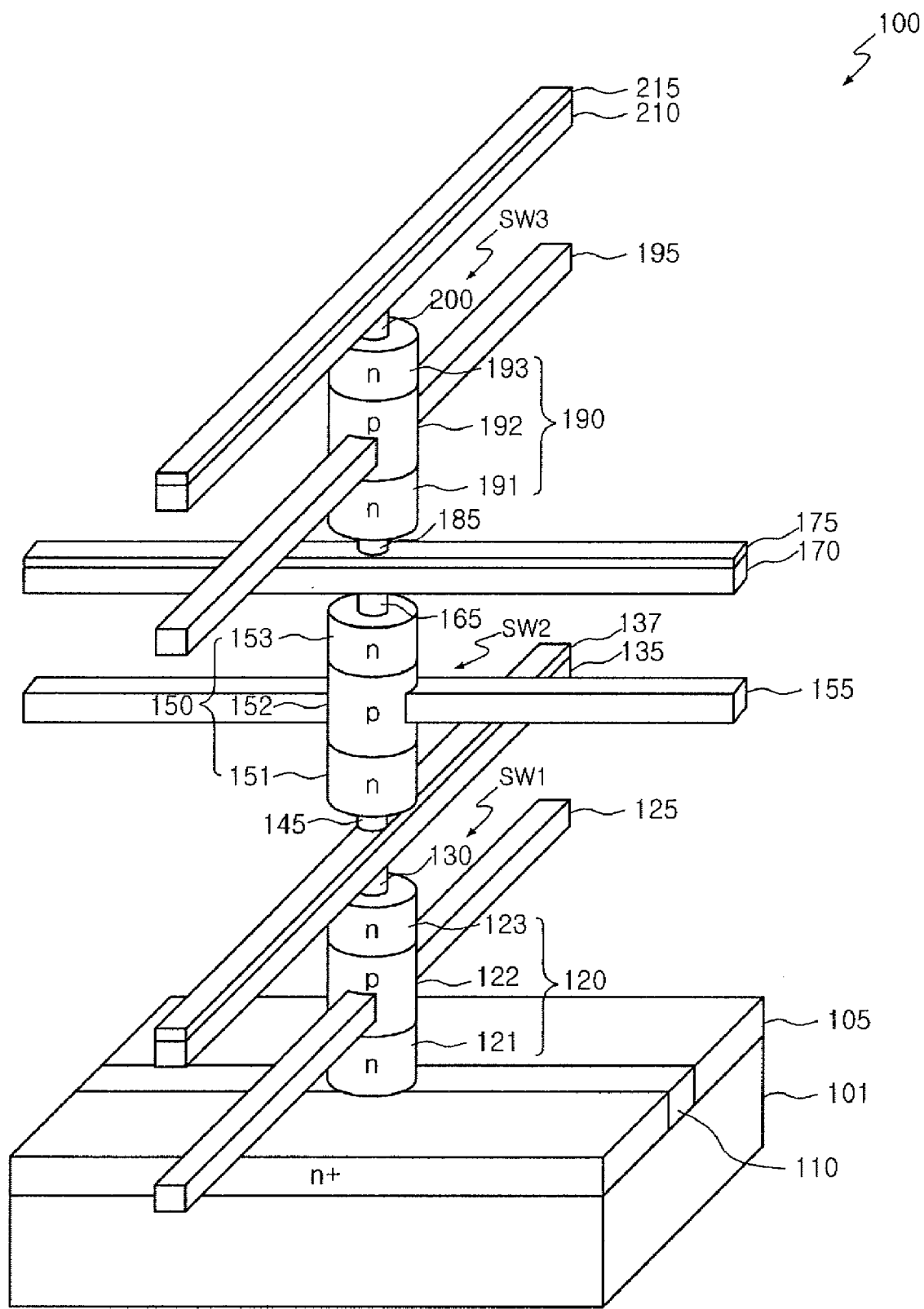
FIG. 1 is a perspective view showing a multi-bit phase-change memory device according to an embodiment of the present invention.
Figure 2:
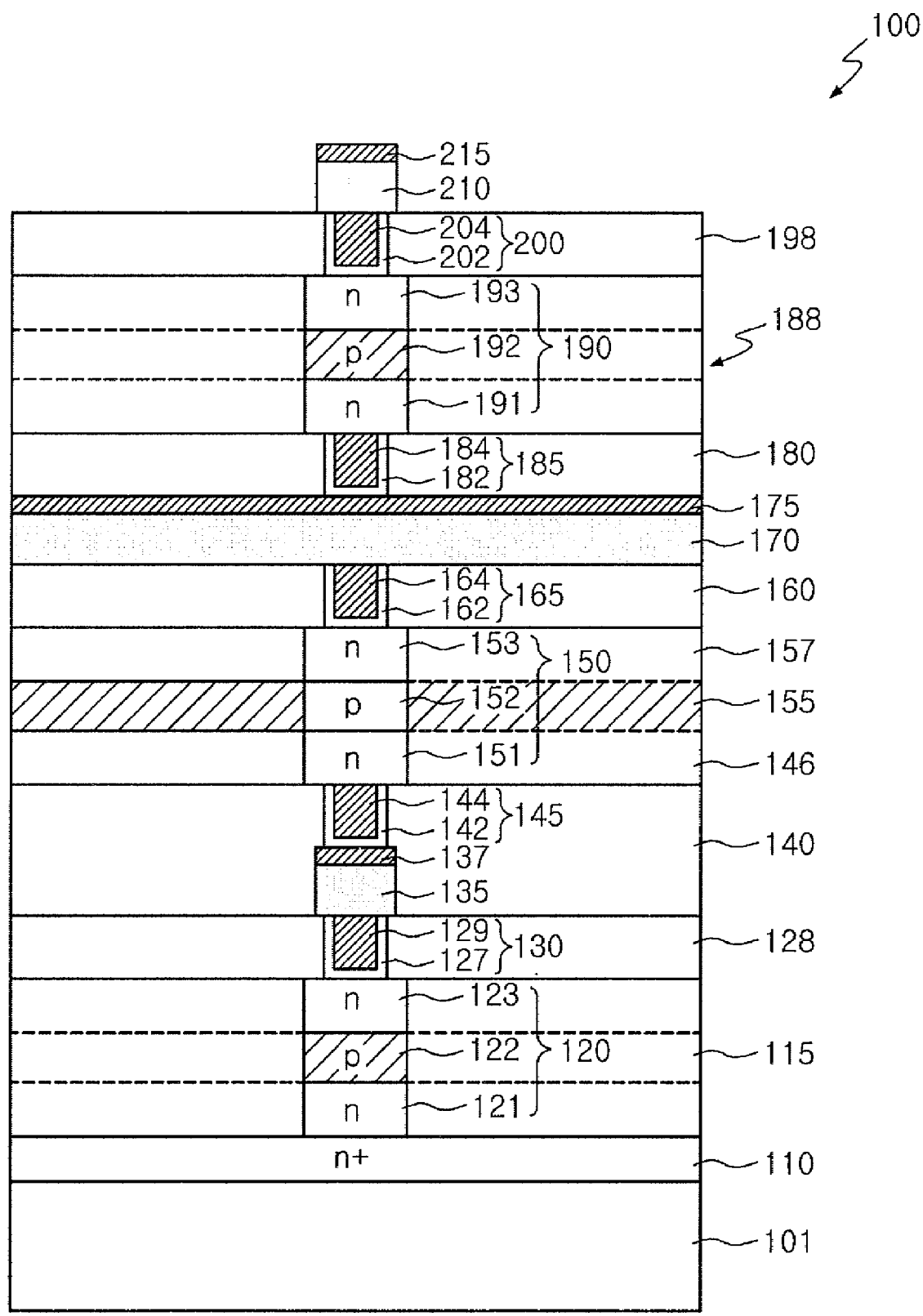
FIG. 2 is a cross-sectional view showing a multi-bit phase-change memory device according to an embodiment of the present invention.

Referring to FIGS. 1 and 2, the multi-bit phase-change memory device 100 can include a plurality of phase-change patterns 135, 170 and 210 which are sequentially stacked on a semiconductor substrate 101 while crossing each other (e.g., in the embodiment shown in FIG. 1 adjacent phase change patterns cross each other).

The semiconductor substrate 101 has an active area 110 that extends in one direction in the semiconductor substrate 101. The semiconductor substrate 101 can include a silicon substrate, a silicon-germanium substrate, or a silicon on insulator (SOI) substrate. The active area 110, for example, may include a heavily doped n type impurity area and is defined by an isolation layer 105.

The phase-change patterns 135, 170 and 210 can have strip shapes (e.g., the phase change patterns can be of a line type) and are spaced apart from each other in the longitudinal direction. Among the phase-change patterns 135, 170 and 210, the first phase-change pattern 135 (i.e., the lowermost phase-change pattern), which is closely adjacent to the semiconductor substrate 101, extends in the direction perpendicular to the extension direction of the active area 110. In addition, the second phase-change pattern 170 extends in a direction perpendicular to the extension direction of the first phase-change pattern 135, which is disposed adjacent to and below the second phase-change pattern 170, and the third phase-change pattern 210 extends in a direction perpendicular to the extension direction of the second phase-change pattern 170, which is disposed adjacent to and below the third phase-change pattern 210. The first phase-change pattern 135 is electrically connected to the active area 110 of the semiconductor substrate 101, and the second phase-change pattern 170 is electrically connected to the first and third phase-change patterns 135 and 210. The phase-change patterns 135, 170 and 210 can include one selected from a group consisting of binary compounds, such as GaSb, InSb, InSe, $Sb_2Te_3$, and Ge; ternary compounds, such as GeSbTe, GaSbTe, InSbTe, $SnSb_2Te_4$, and InSbTe; and quaternary compounds, such as AgInSbTe, (GeSn)SbTe, GeSb(SeTe), and $Te_{81}Ge_{15}Sb_2S_2$.

Conductive lines 137, 175 and 215 can be formed on surfaces of the phase-change patterns 135, 170 and 210, respectively, to facilitate signal transmission. In the embodiment, the conductive lines 137, 175 and 215 will be referred to as phase-change conductive lines. For instance, the respective phase-change conductive lines 137, 175 and 215 can be positioned at the upper portion of the corresponding one of the phase-change patterns 135, 170 and 210. The phase-change conductive lines 137, 175 and 215 include materials having superior conductive characteristics, such as metal, platinum (Pt), tungsten (W), or titanium tungsten (TiW).

Figure 5:
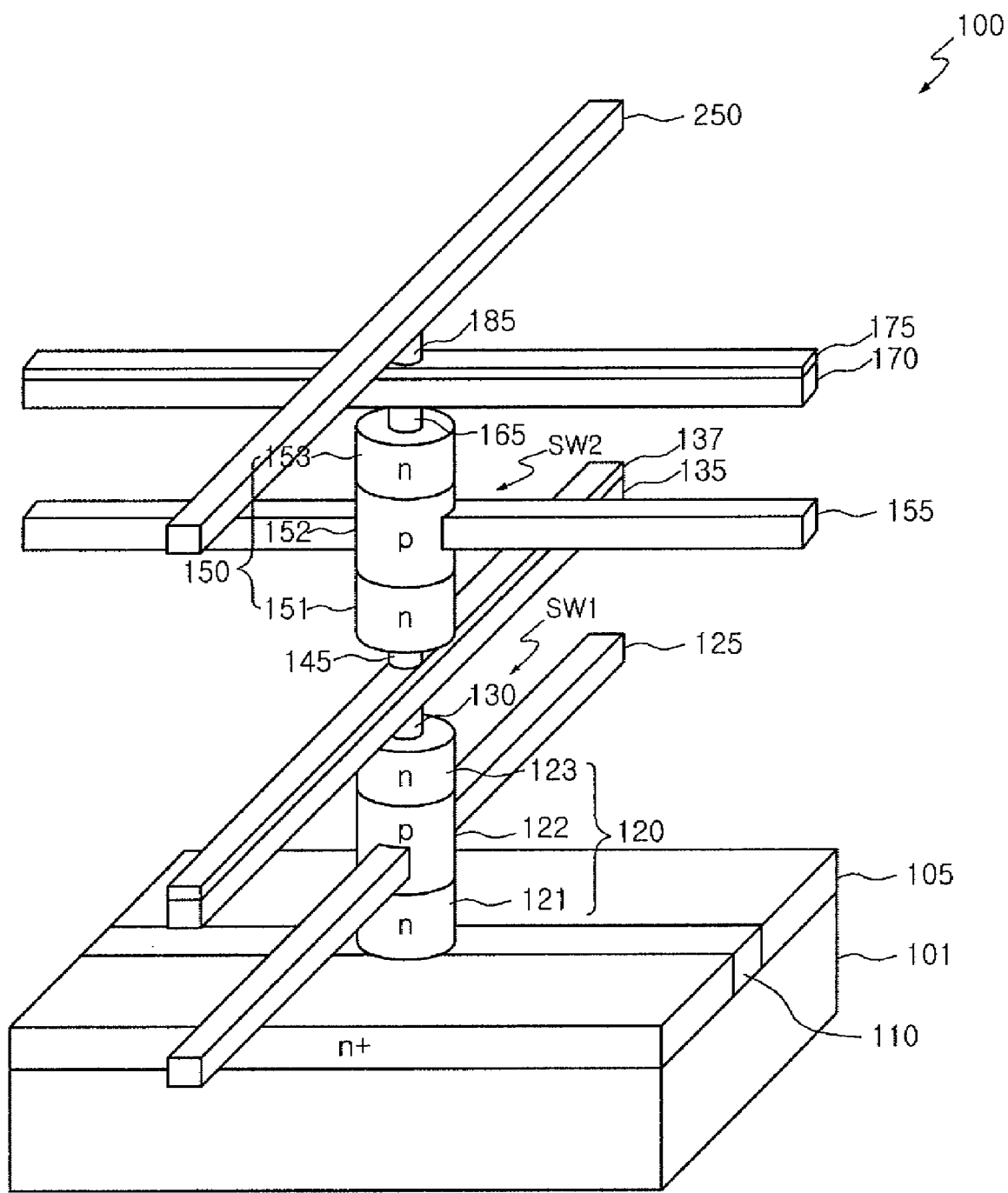
FIG. 5 is a perspective view showing a multi-bit phase-change memory device according to another embodiment of the present invention.

In the embodiment of the present invention shown in FIG. 1, the phase-change patterns 135, 170 and 210 are aligned in a manner such that the extension direction of any two adjacent phase-change patterns can be perpendicular to each other. The uppermost phase-change pattern 210 must extend in the direction perpendicular to the extension direction of the active area 110. In this regard, the total number of the phase-change patterns 135, 170 and 210 must be set as an odd number (the total number of phase change patterns is not limited only to 3). In this case, signals can be easily applied to each conductive line when the phase-change memory device performs read and write operations. If, in the alternative, the total number of the phase-change patterns 135, 170 and 210 is set as an even number, as shown in FIG. 5, a buffer conductive line 250, which extends in a direction perpendicular to the extension direction of the uppermost phase-change pattern and a part of which is electrically connected the uppermost phase-change pattern, must be further provided above the uppermost phase-change pattern (see, 175 in FIG. 1) in order to facilitate signal transmission between the uppermost phase-change pattern and the lowermost phase-change pattern.

In addition, insulating layers 115, 128are interposed between the semiconductor substrate 101 and the first phase-change pattern 135, insulating layers 146, 157, 160 are interposed between the first phase-change pattern 135 and the second phase-change pattern 170, and insulating layers 180, 188, 198 are interposed between the second phase-change pattern 170 and the third phase-change pattern 210 in order to insulate the respective phase-change patterns from each other, as is shown in FIG. 2.

Switching devices sw1, sw2, and sw3 are installed between the active area 110 and the first phase-change pattern 135, between the first phase-change pattern 135 and the second phase-change pattern 170, and between the second phase-change pattern 170 and the third phase-change pattern 210, respectively, in order to selectively change the phase of the first to third phase-change patterns 135, 170 and 210. For instance, in one embodiment of the present invention the switching devices sw1, sw2, and sw3 can include bipolar transistors 120, 150 and 190, respectively. The respective bipolar transistors 120, 150 and 190 are interposed between the insulating layers. If the bipolar transistors are used as the switching devices sw1, sw2, and sw3, the bipolar transistors 120, 150 and 190 can be the same type of bipolar transistor. According to one embodiment of the present invention, a collector (or an emitter) of the lowermost bipolar transistor makes contact with the active area 110, which is an n type impurity area, and thus an npn bipolar transistor is employed. The bipolar transistors 120, 150 and 190 can have a vertical pillar structure, in which n type impurity layers 121, 151 and 191, p type impurity layers 122, 152 and 192, and n type impurity layers 123, 153 and 193 are sequentially stacked. In one embodiment of the present invention, the n and p type impurity layers 121, 122, 123, 151, 152, 153, 191, 192, and 193 can include polysilicon layers doped with p type impurities. The respective lower n type impurity layers 121, 151 and 191 of the bipolar transistors 120, 150 and 190 can serve as collectors (or emitters). In addition, the respective p type impurity layers 122, 152 and 192 can serve as bases and the respective upper n type impurity layers 123, 153 and 193 can serve as emitters (or collectors).

In order to selectively drive the bipolar transistors 120, 150 and 190, base lines 125, 155 and 195 that make contact with the bases 122, 152, 192 can transfer driving start voltage to the bases 122, 152, 192 of the bipolar transistors 120, 150 and 190. The base lines 125, 155 and 195 extend in opposite directions from lateral sides of the bases 122, 152, 192. For instance, the respective base lines 125, 155 and 195 extend in a direction parallel to the extension direction of the corresponding one of the phase-change patterns 135, 170 and 210 disposed above the respective base lines 125, 155 and 195. In one embodiment of the present invention, the base lines 125, 155 and 195 can include polysilicon layers that are integrally formed with the bases 122, 152, 192 and doped with p type impurities. In addition, the bipolar transistors can be formed by burying the bases 122, 152, 192 in the base lines 125, 155 and 195.

Different voltages can be selectively provided to the respective base lines 125, 155 and 195. That is, the bipolar transistors 120, 150 and 190 can be selectively driven to supply the base lines 125, 155 and 195 with different start voltages so as to induce a phase-change in a specific phase-change pattern. According to one embodiment of the present invention, the same driving start voltage is applied to the base lines 125 and 195 that extend in a direction parallel to each other. For instance, the base lines positioned in odd$^{th}$ layers from the semiconductor substrate 101 commonly receive a first voltage, and the base lines positioned in even$^{th}$ layers from the semiconductor substrate 101 commonly receive a second voltage.

Heating electrodes 130, 145, 165, 185 and 200 are provided among the bipolar transistors 120, 150 and 190, the phase-change patterns 135, 170 and 210, and the phase-change conductive lines 137, 175 and 215 in order to vary the crystalline state of the phase-change patterns 135, 170 and 210. The heating electrodes 130, 145, 165, 185 and 200 make contact with the phase-change patterns 135, 170 and 210 while generating heat to change the crystalline state of the phase-change materials of the phase-change patterns 135, 170 and 210. The heat is generated by current supplied from the bottom of the heating electrodes 130, 145, 165, 185 and 200, and therefore the heating electrodes 130, 145, 165, 185 and 200 are fabricated by using materials having a specific resistance that is greater than that of metal electrodes. For instance, the heating electrodes 130, 145, 165, 185 and 200 can include titanium nitride (TiN), titanium oxynitride (TiON), titanium aluminum nitride (TiAlN), tantalum aluminum nitride (TaAlN), or tantalum silicon nitride (TiSiN). Preferably, the contact area of the heating electrodes 130, 145, 165, 185 and 200 relative to the phase-change patterns 135, 170 and 210 is designed to be as small as possible. Thus, the sectional area of the respective heating electrodes 130, 145, 165, 185 and 200 is smaller than the sectional area of the bipolar transistors. As shown in FIG. 2, in one embodiment of the present invention the heating electrodes 130, 145, 165, 185 and 200 can have the shape of contact plugs. For instance, the each of the heating electrodes 130, 145, 165, 185 and 200 can include a corresponding one of the buried metal layers 129, 144, 164, 184 and 204, and a corresponding one of the barrier metal layers 127, 142, 162, 182 and 202 each of which surrounds sidewalls and bottoms of the respective buried metal layers 129, 144, 164, 184 and 204.

As described above, according to the multi-bit phase-change memory device 100 of the present embodiment, the bipolar transistors 120, 150 and 190 are selectively driven, so that the phase of the phase-change patterns 135, 170 and 210, which are stacked while each crosses another, is selective changed. Accordingly, the phase-change memory device 100 can provide one or more intermediate bits in addition to a "0" and a "1" due to the effective resistance of the phase-change patterns 135, 170 and 210 that have been phase-changed.

Figure 3:
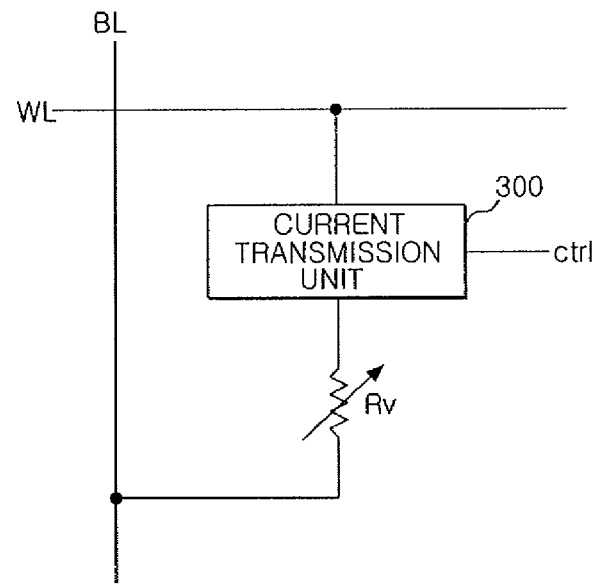
FIG. 3 is an equivalent circuit of a unit cell provided in a multi-bit phase-change memory device according to an embodiment of the present invention.

FIG. 3 is an equivalent circuit of a unit cell provided in the multi-bit phase-change memory device according to an embodiment of the present invention.

As shown in FIG. 3, the multi-bit phase-change memory device according to an embodiment of the present invention can include a current transmission unit 300 and a variable resistor Rv, which are provided between a word line WL and a bit line BL that intersect. The current transmission unit 300 supplies variable current to the variable resistor Rv according to a control signal ctrl. The variable resistor Rv outputs various resistance values according to the variable current supplied from the current transmission unit 300, so that multi-bit can be obtained.

Figure 4:
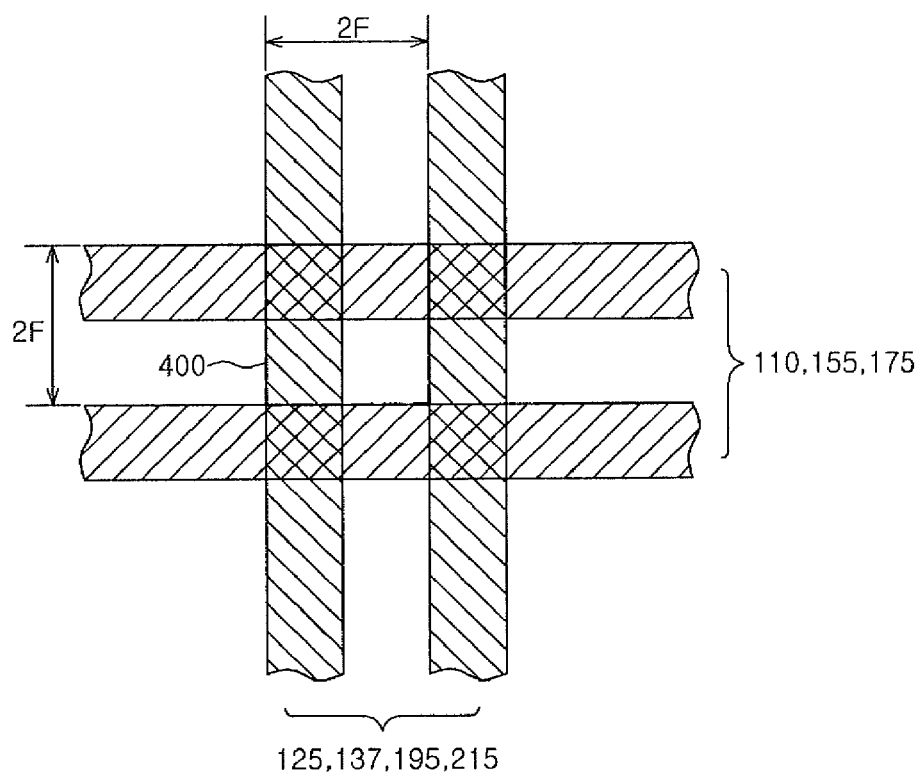
FIG. 4 is a plan view showing a multi-bit phase-change memory device according to an embodiment of the present invention.

In addition, as shown in FIG. 4, if the unit cell 400 of the phase-change memory device is spaced apart from the phase-change patterns (e.g. phase-change patterns 135, 170 and 210), the phase-change conductive lines (e.g. phase-change conductive lines 137, 175, 215 disposed on the phase-change patterns 135, 170 and 210), and the base lines (e.g., base lines 125, 155 and 195) by a line width F in a state in which the phase-change patterns 135, 170 and 210, the phase-change conductive lines 137, 175, 215, and the base lines 125, 155 and 195 have the same line width (F), the unit cell 400 of the phase-change memory device can have an area of $4F^2$. This area is significantly smaller than the area (about $6F^2$) of a unit cell of a typical DRAM memory device. Thus, multi-bit can be obtained without increasing the area of the unit cell 400 of the phase-change memory device. In FIG. 5, the active area 110, the base lines 125, 150 and 195, and phase-change conductive lines 137, 175 and 215, which are opaque mediums, are exclusively shown. As described above, FIG. 5 shows an embodiment of the present invention having an even number of the phase change patterns 135, 170 and a buffer conductive line 250 for facilitating signal transmission between the uppermost phase-change pattern and the lowermost phase change pattern.

As described above, in the phase-change memory device according to an embodiment of the present invention, the phase-change patterns are stacked and extend in a stripe pattern, and each phase-change pattern crosses another phase change pattern; and the switching devices are interposed among the phase-change patterns to selectively apply current to the phase-change patterns.

Therefore, since the phase-change patterns are aligned in different layers, set/reset resistors defined by the phase-change patterns are serially connected to each other in a circuit configuration and current (voltage) is selectively applied to the set/reset resistors from the switching devices, so that the set/reset resistors can represent various phases. Thus, the set/reset resistors can have various resistance values in addition to a resistance value for a logic "0" and a logic "1". Accordingly, the multi-bit phase-change memory device can be obtained without employing new phase-change materials or significantly increasing the area of the unit cell.

The present invention is not limited to the above-described embodiments.

Although the present embodiment is described with reference to three phase-change patterns, the number of phase-change patterns can be increased to realize various bits. In addition, the number of sub-switches can be changed proportionally to the number of the phase-change patterns.

While the present invention has been described with respect to the particular embodiments, it will be apparent to those skilled in the art that various changes and modifications can be made without departing from the spirit and scope of the invention as defined in maythe following claims.

What is claimed is:
1. A multi-bit phase-change memory device comprising:
   a plurality of phase-change patterns which are stacked, each phase-change pattern crossing another phase-change pattern; and
   switching devices interposed among the phase-change patterns in a longitudinal direction to selectively apply current to the phase-change patterns,
   wherein any two adjacent phase-change patterns of the plurality of stacked phase-change patterns are extended in directions that are perpendicular to each other and the switching device is interposed between the two adjacent phase-change patterns that are perpendicular.
2. The multi-bit phase-change memory device of claim 1, further comprising a semiconductor substrate disposed below the phase-change patterns, wherein the semiconductor substrate comprises an active area that extends in a direction perpendicular to a longitudinal direction of a lowermost phase-change pattern of the plurality of phase-change patterns.

3. The multi-bit phase-change memory device of claim 2, wherein a respective switching device of the switching devices is provided between the active area of the semiconductor substrate and the lowermost phase-change pattern.

4. The multi-bit phase-change memory device of claim 1, wherein each of the switching devices comprises a bipolar transistor.

5. The multi-bit phase-change memory device of claim 4, wherein the bipolar transistor comprises a collector including an n type semiconductor layer, a base including a p type semiconductor layer, and an emitter including an n type semiconductor layer, and
wherein the collector, the base, and the emitter are sequentially stacked.

6. The multi-bit phase-change memory device of claim 4, further comprising base lines each electrically connected to a base line of the bipolar transistor of a respective one of the switching devices, wherein each base line supplies a driving start voltage to the bipolar transistor.

7. The multi-bit phase-change memory device of claim 6, wherein each base line extends from opposite lateral sides of the base in a direction parallel to the extension direction of the phase-change pattern disposed adjacent to and above the base line.

8. The multi-bit phase-change memory device of claim 6, wherein a first voltage is applied to each of the base lines positioned in an $odd^{th}$ layer from the semiconductor substrate, and a second voltage is applied to each of the base lines positioned in an $even^{th}$ layer from the semiconductor substrate.

9. The multi-bit phase-change memory device of claim 1, wherein the phase-change patterns include at least one selected from the group consisting of a binary compound, such as GaSb, InSb, InSe, $Sb_2Te_3$, and Ge; a ternary compound, such as GeSbTe, GaSbTe, InSbTe, $SnSb_2Te_4$, and InSbTe; and a quaternary compound s, such as AgInSbTe, (GeSn)SbTe, GeSb(SeTe), and $Te_{81}Ge_{15}Sb_2S_2$.

10. The multi-bit phase-change memory device of claim 1, further comprising heating electrodes each interposed between one of the phase-change patterns and one of the switching devices.

11. The multi-bit phase-change memory device of claim 10, wherein at least one of the heating electrodes comprises a buried metal layer and a barrier, metal layer that surrounds sidewalls and a bottom of the buried metal layer.

12. The multi-bit phase-change memory device of claim 1, wherein a total number of the phase-change patterns is odd.

13. The multi-bit phase-change memory device of claim 1, wherein a total number of the phase-change patterns is even, and a buffer conductive line is disposed above an uppermost phase-change pattern of the plurality of phase change patterns, wherein the buffer conductive line extends in a direction perpendicular to the extension direction of the uppermost phase-change pattern.

14. The multi-bit phase-change memory device of claim 1, further comprising an insulating layer interposed between the phase-change patterns.

15. A multi-bit phase-change memory device comprising:
a semiconductor substrate;
a plurality of phase-change patterns sequentially stacked above the semiconductor substrate, each phase-change pattern crossing another phase-change pattern, and each phase-change pattern having a phase-change conductive line formed on at feast one surface thereof;
bipolar transistors disposed between the semiconductor substrate and a lowermost phase-change pattern of the plurality of phase change patterns and between the phase-change patterns that are crossed, wherein the bipolar transistors selectively form an electrical connection between the semiconductor substrate and the lowermost phase-change pattern and among the phase-change patterns; and
heating electrodes disposed between the bipolar transistors and the phase-change patterns,
wherein the semiconductor substrate comprises an active area that extends in a direction perpendicular to a longitudinal direction of the lowermost phase-change pattern.

16. The multi-bit phase-change memory device of claim 15, wherein the phase-change conductive line comprises at least one of platinum (Pt), tungsten (vv), and titanium tungsten (TiW).

17. The multi-bit phase-change memory device of claim 15, wherein a total number of the phase-change patterns is odd, and wherein an uppermost phase-change pattern of the plurality of phase change patterns extends in a direction that is perpendicular to the extension direction of the active area.

18. The multi-bit phase-change memory device of claim 15, wherein, when a total number of the phase-change patterns is even, and wherein an uppermost phase-change pattern of the plurality of phase change patterns extends in a direction that is parallel to the extension direction of the active area, and a buffer conductive line is provided above the uppermost phase-change pattern and extends in a direction that is perpendicular to the extension direction of the uppermost phase-change pattern.

19. The multi-bit phase-change memory device of claim 15, wherein each bipolar transistor comprises a collector including an n type semiconductor layer, a base including a p type semiconductor layer, and an emitter including an n type semiconductor layer, and
wherein the collector, the base and the emitter are sequentially stacked.

20. The multi-bit phase-change memory device of claim 19, further comprising base lines each electrically connected to the base of one of the bipolar transistors to supply a driving start voltage to the bipolar transistor.

21. The multi-bit phase-change memory device of claim 20, wherein each base line extends from opposite lateral sides of the base in a direction parallel to the extension direction of the phase-change pattern disposed adjacent to and above the base line.

22. The multi-bit phase-change memory device of claim 20, wherein a first voltage is applied to each of the base lines of the bipolar transistors positioned in an $odd^{th}$ layer from the semiconductor substrate, and a second voltage is applied to each of the base lines of the bipolar transistors positioned in an $even^{th}$ layer from the semiconductor substrate.

23. The multi-bit phase-change memory device of claim 19, wherein at least one of the heating electrodes comprises a buried metal layer and a barrier metal layer that surrounds sidewalls and a bottom of the buried metal layer.

24. The multi-bit phase-change memory device of claim 19, wherein insulating layers are installed between the semiconductor substrate and the lowermost phase-change pattern and among the phase-change patterns, respectively, and wherein one or more of the bipolar transistors and the heating electrodes are formed in the insulating layers.

* * * * *